US009697897B2

(12) United States Patent
Sadd et al.

(10) Patent No.: US 9,697,897 B2
(45) Date of Patent: Jul. 4, 2017

(54) MEMORY DEVICE WITH COMBINED NON-VOLATILE MEMORY (NVM) AND VOLATILE MEMORY

(71) Applicants: Michael A Sadd, Austin, TX (US); Anirban Roy, Austin, TX (US)

(72) Inventors: Michael A Sadd, Austin, TX (US); Anirban Roy, Austin, TX (US)

(73) Assignee: NXP USA, Inc., Austin, TX (US)

( * ) Notice: Subject to any disclaimer, the term of this patent is extended or adjusted under 35 U.S.C. 154(b) by 103 days.

(21) Appl. No.: 14/331,274

(22) Filed: Jul. 15, 2014

(65) Prior Publication Data

US 2016/0019964 A1 Jan. 21, 2016

(51) Int. Cl.
*G11C 14/00* (2006.01)

(52) U.S. Cl.
CPC ............................. *G11C 14/0063* (2013.01)

(58) Field of Classification Search
CPC ................................................ G11C 14/0063
USPC .................................................... 365/185.08
See application file for complete search history.

(56) References Cited

U.S. PATENT DOCUMENTS

| 6,222,765 | B1 | 4/2001 | Nojima |
| 6,324,116 | B1* | 11/2001 | Noh ..................... G06F 12/0893 365/220 |
| 6,828,823 | B1 | 12/2004 | Tsui et al. |
| 7,081,771 | B2 | 7/2006 | Agrawal et al. |
| 7,099,189 | B1 | 8/2006 | Plants |
| 7,539,054 | B2 | 5/2009 | Ashokkumar et al. |
| 7,760,540 | B2 | 7/2010 | Still |
| 8,531,880 | B2 | 9/2013 | Rao |
| 2006/0193174 | A1 | 8/2006 | Choi et al. |
| 2007/0189062 | A1 | 8/2007 | Plants |
| 2007/0211551 | A1* | 9/2007 | Yogev ..................... G11C 16/30 365/226 |
| 2008/0158981 | A1* | 7/2008 | Johal ..................... G11C 16/26 365/185.19 |
| 2008/0192560 | A1 | 8/2008 | Lee et al. |
| 2011/0044109 | A1 | 2/2011 | Shih et al. |
| 2013/0215669 | A1 | 8/2013 | Haukness |
| 2014/0078810 | A1* | 3/2014 | Prenat ..................... G11C 11/16 365/148 |
| 2014/0085978 | A1* | 3/2014 | Lee ..................... G11C 14/0063 365/185.08 |

OTHER PUBLICATIONS

Choi, "Single-Chip Integration of SRAM and Non-volatile Memory using Bit-line Sharing", Solid-State Circuits Conference, 2006. ESSCIRC 2006. Proceedings of the 32nd European, DOI: 10.1109/ESSCIR.2006.307589; Publication Year: 2006, pp. 295-298.

(Continued)

*Primary Examiner* — Hoai V Ho
*Assistant Examiner* — Muna A Techane

(57) ABSTRACT

A memory device includes a volatile memory cell, a non-volatile memory cell, and a transfer system connected between the volatile memory cell and the non-volatile memory cell. The transfer circuit allows data transfer from the volatile memory cell to the non-volatile memory cell when the memory device is operating in a first mode, and from the non-volatile memory cell to the volatile memory cell when the memory device is operating in a second mode.

12 Claims, 3 Drawing Sheets

(56) References Cited

OTHER PUBLICATIONS

Abe et al, "Novel hybrid DRAM/MRAM design for reducing power of high performance mobile CPU", IEEE International Electron Devices Meeting (IEDM), Dec. 10-13, 2012, pp. 10.5.1-10.5.4, San Francisco, CA.
Yamamoto, "Nonvolatile SRAM (NV-SRAM) using functional MOSFET merged with resistive switching devices", Custom Integrated Circuits Conference, Sep. 13-16, 2009, pp. 531-534, IEEE, San Jose, CA.
Wang et al, "Nonvolatile SRAM Cell", International Electron Devices Meeting, Dec. 11-13, 2006, pp. 1-4, IEEE, San Francisco, CA.
Tanaka et al, "Normally-off type nonvolatile static random access memory with perpendicular spin torque transfer-magnetic random access memory cells and smallest number of transistors", Japanese Journal of Applied Physics, 2014, pp. 1-4, vol. 53, No. 48.
Office Action Non-Final U.S. Appl. No. 14/626,177 May 8, 2017, 38 pages.

\* cited by examiner

MEMORY DEVICE WITH COMBINED NON-VOLATILE MEMORY (NVM) AND VOLATILE MEMORY

BACKGROUND

Field

This disclosure relates generally to memory devices and, more particularly to memory devices that combine volatile memory and NVM.

Related Art

One aspect of NVM is that it has slower access speeds than volatile memories, especially static random access memories. Also, NVMs typically have lifetimes limited by the number of program/erase cycles that they undergo. One approach to addressing these issues is to have the normal operations carried out using the SRAM and then, when powering down, storing the data that is to be retained in the NVM. When operations are to continue and power is present, the data stored in NVM is restored to the SRAM. Thus, normal operations are achieved with the SRAM with the attendant benefits thereof and the non-volatile function is present when power is removed. Efficient combining of the NVM and the SRAM is difficult due to the very different operating characteristics. Combining the NVM and SRAM into a single memory array is thus difficult. One example is that optimizing the program and erase functions may be in conflict with the SRAM operation. This is further complicated by the voltages that are required for program and erase are not needed for SRAM operation so that the transistors of the SRAM are preferably not made with the complicating high voltage considerations in mind.

Accordingly there is a need to provide further improvement in achieving combined volatile and non-volatile memories.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a storage node of a volatile memory is coupled to a bit line of the non-volatile memory (NVM) for restoring data in the volatile memory and the storage node of the volatile memory is used to provide either a modified signal to the bit line of the NVM for storing or is coupled to a complementary bit line of the NVM. This is better understood by reference to the drawings and the following written description.

Figure 1:
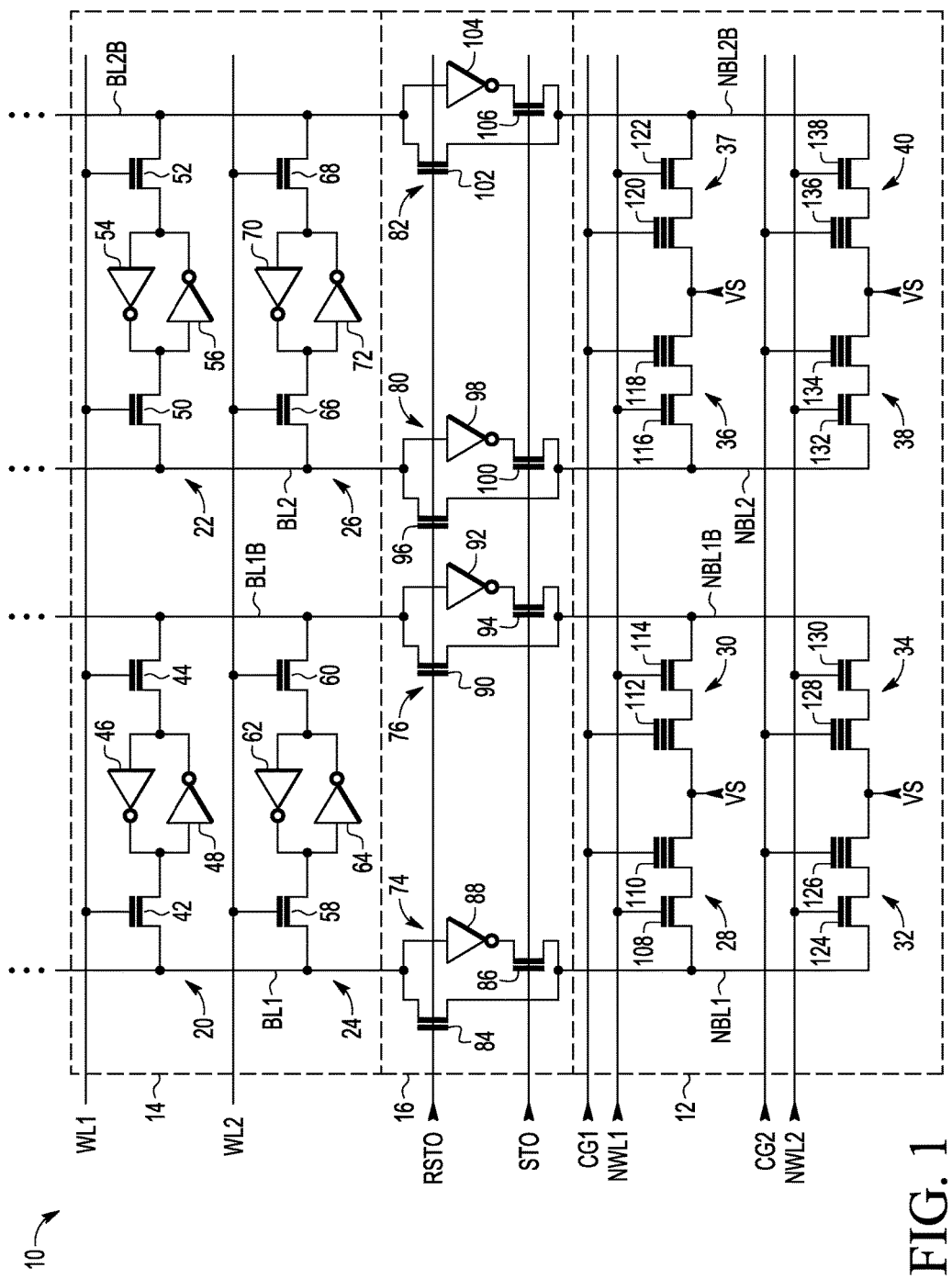
FIG. 1 is a circuit diagram showing a memory device having a combined volatile memory and a non-volatile memory (NVM)

Shown in FIG. 1 is a memory device 10 having a volatile memory array 14, an NVM array 12, and a transfer system 16. Volatile memory array 14 has a memory cell 20, a memory cell 22, a memory cell 24, and a memory cell 26. NVM array 12 has a true memory cell 28 and a complementary cell 30 that together include true and complementary data, a true memory cell 32 and a complementary cell 34 that together include true and complementary data, a true memory cell 36 and a complementary cell 38 that together include true and complementary data, and a true memory cell 38 and a complementary cell 40 that together include true and complementary data. The combination of the true and complement are considered a bit and thus the combination of true memory cell 38 and complementary cell 40 may be considered a bit cell 38/40. Transfer system 16 has a transfer circuit 74 and a transfer circuit 76 that together form a transfer circuit for non-volatile bit line NBL1 and its complement NBL1B, and transfer system 16 further has a transfer circuit 80 and a transfer circuit 82 that together form a transfer circuit for non-volatile bit line NBL2 and its complement NBL2B. Each true and complementary cell are shown as each having both a control gate and a select gate which may implemented as a split gate memory cell or a two transistor memory cell. Also, it may be advantageous in some circumstances to simply have a one transistor NVM cell.

Memory cell 20 has pass gates 42 and 44 and inverters 46 and 48. Memory cell 22 has pass gates 50 and 52 and inverters 54 and 56. Memory cell 24 has pass gates 58 and 60 and inverters 62 and 64. Memory cell 26 has pass gates 66 and 68 and inverters 70 and 72. Pass gate 42 has a first current electrode coupled to bit line BL1, a control electrode coupled to a word line WL1, and a second current electrode coupled an input of inverter 48 and an output of inverter 46. Pass gate 44 has a first current electrode coupled to complementary bit line BL1B, a control electrode coupled to word line WL1, and a second current electrode coupled to the output of inverter 48 and the input of inverter 46. The input/output connections of inverters 46 and 48 are the storage nodes of memory cell 20. In this example, memory cell 20 is a static random access (SRAM) cell connected in conventional fashion to bit lines BL1 and BLB1 and word line WL1. Memory cells 22, 24, and 26 are similarly connected in conventional SRAM fashion. Memory cell 22 is coupled to bit line BL2, complementary bit line BL2B, and word line WL1. Memory cell 24 is coupled to bit line BL1, complementary bit line BL1B, and word line WL2. Memory cell 26 is coupled to bit line BL2, complementary bit line BL2B, and word line WL2.

Transfer circuit 74 is coupled between bit line BL1 and bit line NBL1, which is a non-volatile bit line as indicated by the "N" in front of BL. Transfer circuits 74, 76, 78, and 80 receive a restore signal RSTO and a store signal STO. Restore occurs, as indicated by restore signal RSTO being active, when volatile memory array 14 is loaded with data that has been kept in NVM array 12, typically in response to power being restored. Store occurs, as indicated by signal STO being active, when NVM array 12 is loaded with the most recent data present in volatile memory array 14, typically in preparation for a loss of power. Transfer circuit 76 is coupled between complementary bit line BL1B and complementary bit line NBL1B, transfer circuit 80 is coupled between bit line BL2 and bit line NBL2, and transfer circuit 82 is coupled between bit line BL2 and bit line NBL2. Transfer circuit 74 has a transistor 84, a transistor 86, and an inverter 88 each of which may be considered an element of transfer circuit 74. In particular, inverter 88 may be considered a type of transfer element as may inverters 92, 98, and 104. Transistor 84 has first current electrode coupled to bit line BL1, a control electrode coupled to restore signal RSTO, and a second current electrode coupled to bit line NBL1. Inverter 88 has an input coupled to bit line BL1 and an output. Transistor 86 has a first current electrode coupled to the output of inverter 88, a second current electrode coupled to bit line NBL1, and a control electrode coupled to receive storage signal STO. Transfer circuit 76 has a transistor 90, a transistor 94, and an inverter 92. Transistor 90 has first current electrode coupled to complementary bit line BL1B, a control electrode coupled to restore signal RSTO, and a second current electrode coupled to complementary bit line NBL1. Inverter 92 has an input coupled to complementary bit line BL1B and an output. Transistor 94 has a first current electrode coupled to the output of inverter 92, a second current electrode coupled to bit line NBL1, and a control electrode coupled to receive storage signal STO. Transfer circuit 80 has a transistor 96, a transistor 100, and an inverter 98. Transistor 96 has first current electrode coupled to bit line BL2, a control electrode coupled to restore signal RSTO, and a second current electrode coupled to bit line NBL2. Inverter 98 has an input coupled to bit line BL2 and an output. Transistor 100 has a first current electrode coupled to the output of inverter 98, a second current electrode coupled to bit line NBL2, and a control electrode coupled to receive storage signal STO. Transfer circuit 82 has a transistor 102, a transistor 106, and an inverter 104. Transistor 102 has first current electrode coupled to complementary bit line BL2B, a control electrode coupled to restore signal RSTO, and a second current electrode coupled to complementary bit line NBL2. Inverter 104 has an input coupled to complementary bit line BL2B and an output. Transistor 106 has a first current electrode coupled to the output of inverter 104, a second current electrode coupled to bit line NBL2, and a control electrode coupled to receive storage signal STO.

Memory cell 28 has a first current electrode coupled to bit line NBL1, a select gate structure 108 having a select gate coupled to a word line NWL1, which is a word line of NVM array 12 and indicated by the N at the beginning of NWL1, a control gate structure 110 having a control gate coupled to a control gate signal CG1, and second current electrode coupled to a source signal VS. Memory cell 30 has a first current electrode coupled to complementary bit line NBL1B, a select gate structure 114 having a select gate coupled to word line NWL1, a control gate structure 112 having a control gate coupled to control gate signal CG1, and second current electrode coupled to source signal VS. Memory cell 28 stores data complementary to that stored in memory cell 30 so that the combination of memory cell 28 and memory cell 30 represent a single bit having a true and a complement and may be referenced as bit cell 28/30 or NVM cell 28/30. This is true of all of the NVM cells in that a true and a complement is present for pairs of cells coupled between true and complementary bit lines and coupled to the same word line. Memory cell 32 has a first current electrode coupled to bit line NBL1, a select gate structure 124 having a select gate coupled to word line NWL2, a control gate structure 126 having a control gate coupled to a control gate signal CG2, and second current electrode coupled to source signal VS. Memory cell 34 has a first current electrode coupled to complementary bit line NBL1B, a select gate structure 130 having a select gate coupled to word line NWL2, a control gate structure 128 having a control gate coupled to control gate signal CG2, and second current electrode coupled to source signal VS. Memory cell 36 has a first current electrode coupled to bit line NBL2, a select gate structure 116 having a select gate coupled to word line NWL1, a control gate structure 118 having a control gate coupled to control gate signal CG1, and second current electrode coupled to source signal VS. Memory cell 37 has a first current electrode coupled to complementary bit line NBL2B, a select gate structure 122 having a select gate coupled to word line NWL1, a control gate structure 120 having a control gate coupled to control gate signal CG1, and second current electrode coupled to source signal VS. Memory cell 36 has a first current electrode coupled to bit line NBL2, a select gate structure 132 having a select gate coupled to word line NWL2, a control gate structure 134 having a control gate coupled to control gate signal CG2, and second current electrode coupled to source signal VS. Memory cell 40 has a first current electrode coupled to complementary bit line NBL2B, a select gate structure 138 having a select gate coupled to word line NWL2, a control gate structure 136 having a control gate coupled to control gate signal CG2, and second current electrode coupled to source signal VS. As shown in FIG. the select gate structures 108, 114, 116, 122, 124, 130, 132, and 138 can be viewed as functioning as access transistors.

In operation, data is written into and read from volatile memory array 14 at relatively high speed during normal operation when power is present. In preparation for power being removed, the data from volatile memory array 14 is written into NVM array 12. This operation may be called storing. When power is no longer present, the data is lost from volatile memory array 14 and maintained in NVM array 12. When power returns, the data present in NVM array 12 is loaded into volatile memory array 14. This operation may be called restoring. Thus, for example, the operation may be taken as power has been restored and data that is stored in NVM array 12 is to be written into volatile memory array 14 so that restoring is set to begin. The state of the bit stored in NVM cell 28/30 is to be written into memory cell 20, and the state of the bit stored in NVM cells by enabling restore signal RSTO, word line WL1, word line NWL1, and control gate signal CG1. Enabling restore signal RSTO causes transistor 84 to be conductive. Enabling word line WL1 causes transistors 42 and 44 to be conductive. Enabling word line NWL1 and control gate signal CG1 causes the state of memory cell 28 to be coupled to bit line NBL1 and the state of memory cell 30, which is complementary to the logic state of memory cell 28, to be coupled to bit line NBL1B. This logic state may be referenced as the logic state of NVM cell 28/30. With transistors 84 and 90 conductive, the state of bit lines NBL1 and NBL1B are coupled to bit lines BL1 and BL1B, respectively. Transistors 42 and 44, being conductive, couples the states of bit lines BL1 and BL1B to inverters 46 and 48 so that the logic state of NVM cell 28/30 is latched. Similarly for memory cell 22, transistors 96 and 102 couple the state of the true and complements of NVM cells 36 and 37 to bit lines NBL2 and NBL2B, respectively, to bit lines BL2 and BL2B. Transistors 50 and 52 being conductive results in the logic state of bit cell 36/37 being latched by inverters 54 and 56. After successfully writing into the memory cells along word line WL1, control gate signal CG1 and word line WL1 becomes inactive. So that NVM cells 28/30 and 36/37 are no longer coupled to bit lines NBL1/NBL1B and NBL2/NBL2B, respectively. Control gate signal CG2, word line NWL2, and word line WL2 are activated. This results in the logic state of NVM cell 32/34 being coupled to bit lines NBL1/NBL1B and the logic state of NVM cell 38/40 being coupled to bit lines NBL2/NBL2B. With transistors 84, 90, 96, and 102 conductive, the logic states of NVM cells 32/34 and 38/40 are coupled to bit lines BL1/BL1B and BL2/BL2B, respectively. With transistors 58, 60, 66, and 68 being conductive due to word line WL2 being active, the inverter pair 58/60 latch the state on bit line pair BL1/BL1B and inverter pair 66/68 latch the state of bit line pair BL2/BL2B. Word line WL2, word line NWL2, and control gate signal CG2 may then be made inactive with the result that memory cell 24 and memory cell 26 now contain the logic states stored in NVM cells 32/34 and 38/40, respectively. The process continues with memory cells on other bit lines and word lines not shown until the restoring of data in the volatile memory is complete. Restore signal RSTO is made inactive and transistors 86, 90, 96, and 102 are made non-conductive decoupling the NVM bit lines form the volatile memory bit lines. Normal read/write operations of volatile memory array 14 may then commence.

At some subsequent point, preparations for power being removed will begin by erasing NVM array 12 which may be done simultaneously for all of the cells. The desired voltages for erase may thus be applied to bit lines NBL1/NBL1B and NBL2/NBL2B while also selected the desired voltage for VS. The voltage levels for word lines NWL1 and NWL2 and for control gate signals CG1 and CG2 are also applied. The particular voltage levels will depend on the particular choices made for construction of the NVM cells. The erasing may occur any time after restoring and may be immediately after restoring. During erasing store signal STO and restore signal RESTO will be inactive so that the volatile memory bit lines will be isolated from the NVM bit lines. Erasing may be done be Fowler-Nordheim tunneling. The erased condition is a logic low condition by inducing low threshold voltages.

When the power removal is imminent, operations with volatile memory array 14 would normally be expected to cease. The process of storing the data from programming NVM array 12 then begins. The process of storing, after erasing has occurred, is programming. Programming in this example, is achieved with hot carrier injection. Where programming is to occur, current flows through the cell and thus both the select gate and the control gate are a sufficiently high voltage to allow the needed current to pass through the cell. Source voltage VS is elevated and current flows when the bit line is a logic low, causing the current flow from which electrons become sufficiently energetic to move a charge storage layer, which may have nanocrystals for the charge storage. Beginning with programming along word line NWL1, word line WL1, word line NWL1, storage signal STO, and control gate signal CG1 are active. With word line WL1 active, memory cell 20 provides its logic state to bit lines BL1 and BL1B which is then inverted by inverters 88 and 92, respectively, and then coupled to bit lines NBL1 and NBL1B through transistors 86 and 94, respectively. For the case of a logic high, a logic low is coupled to bit line NBL1 and a logic high is coupled to NBL1B. With a logic low applied to bit line NBL1, current is provided through memory cell 28 from source voltage VS to bit line NBL1. With a logic high applied to bit line NBL1B, current is impeded from passing through memory cell 30. The result is that memory cell 28 is programmed to a logic high and memory cell 30 remains as a logic low. Thus NVM cell 28/30 has been successfully programmed to a logic high to match the logic high of memory cell 20. By having the logic high programming achieved with the memory cell being programmed to the logic high being at the high voltage of voltage VS, the hot carrier injection is most efficient because the carriers are most energetic at voltage VS and thus most easily injected into the charge storage layer. A similar operation occurs for transferring the data from memory cell 22 to bit cell 36/37. For the case of memory cell 22 being a logic low, bit lines BL2 and BL2B are at a logic low and logic high, respectively, so that, through inverters 98 and 104, bit lines NBL2 and NBL2B are at a logic high and logic low respectively. This results in sufficient current passing from source voltage VS to bit line NBL2B to program memory cell 37 to a logic high. Because current is impeded because of the logic low on bit line NBL2, memory cell 36 remains at a logic low. Source voltage VS may be applied as pulses and may vary in voltage.

For storing in the memory cells along word line NWL2, word line WL1 is made inactive, word line WL2 is made active, control gate signal CG1 is made active, word line NWL1 is made inactive, word line WL2 Is made active, and control gate CG2 is made active. In this case, for the case of memory cell 24 being a logic low, bit line BL1 is a logic low and bit line NBL1 is a logic high due to the inversion by inverter 88. Similarly, bit line BL1B is a logic high resulting in bit line NBL1B being a logic low due to inverter 92. The result is memory cell 32 is kept at a logic low and memory cell 34 is programmed to a logic high. Assuming memory cell 26 is a logic high, bit lines BL2 and BL2B are a logic high and logic low, respectively; bit lines NBL2 and NBL2B are a logic low and logic high, respectively; memory cells 38 and 40 are a logic high and a logic low respectively; and bit cell 38/40 is a logic high. The process continues until all of the volatile memory that is to be stored has been stored. Power down can then commence. The cycle continues with a restore when power returns.

Figure 2:
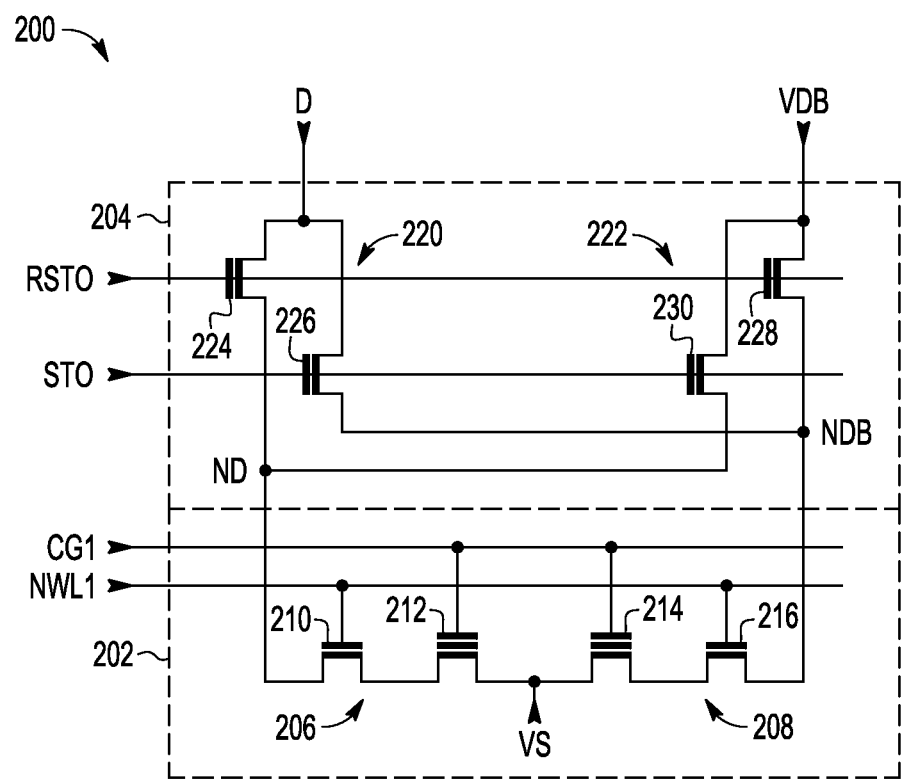
FIG. 2 is a circuit diagram of an alternative to a portion of the combined volatile memory and NVM of FIG. 1.

Shown in FIG. 2 is a system 200 that includes a transfer system 204 that may be used to replace transfer system 16. System 200 has a transfer system 204 and a non-volatile bit cell 202, such as NVM cell 28/30 in FIG. 1, coupled to transfer system 204. Bit cell 202 has a non-volatile memory cell 206 and a non-volatile memory cell 208. Memory cell 206 has a first current electrode coupled to a non-volatile line ND that is analogous to a bit line such as bit line NBL1 of NVM array 12, a select gate coupled to a word line NWL1, a control gate coupled to receive a control gate signal CG1, and a second current terminal coupled to a source voltage VS. Memory cell 208 has a first current electrode coupled to a non-volatile line NDB that is analogous to a bit line such as bit line NBL1B of NVM array 12, a select gate coupled to word line NWL1, a control gate coupled to receive control gate signal CG1, and a second current terminal coupled to source voltage VS. Transfer system 204 has a transfer circuit 220 and a transfer circuit 222. Transfer circuit 220 has a transistor 224 and a transistor 226. Transistor 224 has a first current electrode coupled to a line D that is analogous to a bit line such as bit line BL1 of volatile memory array 14, a control electrode coupled to receive restore signal RSTO, and a second current electrode coupled to line ND. Transistor 226 has a first current electrode coupled to line D, a control electrode coupled to receive store signal STO, and a second current electrode coupled to line NDB. Transfer circuit 223 has a transistor 230 and a transistor 228. Transistor 228 has a first current electrode coupled to a line DB that is analogous to a bit line such as bit line BL1B of volatile memory array 14, a control electrode coupled to receive restore signal RSTO, and a second current electrode coupled to line NDB. Transistor 226 has a first current electrode coupled to line DB, a control electrode coupled to receive store signal STO, and a second current electrode coupled to line ND.

In operation a restore function is performed as for transfer system 16 of FIG. 1. Bit cell 202 couples the true and complement of the stored data on lines ND and NDB. Transistors 224 and 228 are active with restore signal RSTO being active so that the true and complementary data present on lines ND and NDB are provided onto lines D and DB, respectively. For the case of storing data in bit cell 202, store signal STO is active so that transistors 226 and 230 are conductive, restore signal RSTO is not active so that transistors 224 and 228 are non-conductive, word line NWL1 is active, and control gate signal CG1 is active. In this situation, the logic state of line D is coupled to line NDB and the logic state of line DB is coupled to line ND. In the case that the logic state of line D is a logic high, then the logic state of line DB will be a logic low which will be coupled to line ND which will in turn allow current to pass from source voltage through memory cell 206 to line ND thereby programming memory cell to a logic high. With line NDB at a logic high, current will be impeded through memory cell 208 and memory cell 208 will remain erased. This is a very efficient transfer system in terms of the devices required. The volatile memory should be designed with a view to ensuring that sufficient current can pass through the non-volatile memory cells to provide the needed programming.

Figure 3:
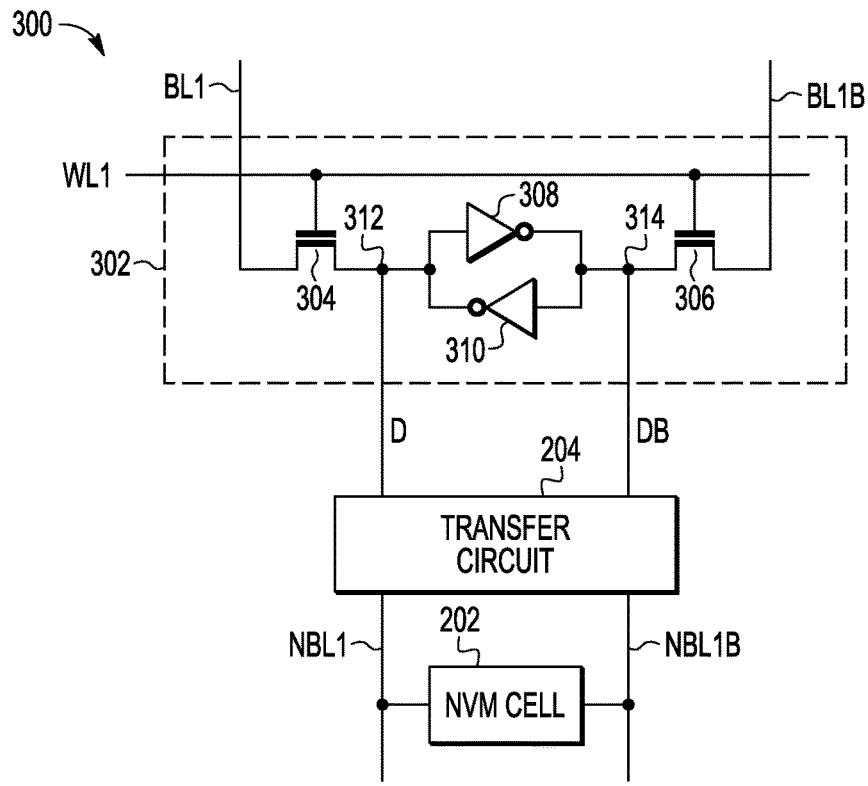
FIG. 3 is a circuit diagram of another alternative to a portion of the combined volatile memory and NVM of FIG. 1.

Shown in FIG. 3 is a system 300 that incorporates the system of FIG. 2 by directly coupling the true and complementary data lines of FIG. 2 to storage nodes 312 and 314 of a memory element 302 that may otherwise be a conventional SRAM cell. Storage nodes 312 and 314 are at the connection points of cross-coupled inverters 308 and 310. Other storage cells not shown also have direct connections to their storage nodes. In system 300, because of the direct connections to the storage nodes, each memory element may simultaneously perform the store or restore operation.

Figure 4:
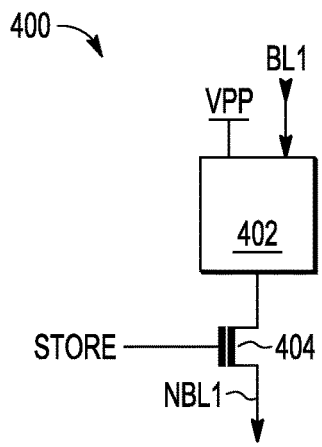
FIG. 4 is a circuit diagram of yet another alternative to a portion of the combined volatile memory and NVM of FIG. 1.

Shown in FIG. 4 is a partial transfer circuit having a driver circuit 402 and a transistor 404 that can be used to replace the inverter/transistor combination such as inverter 88 and transistor 86 of transfer circuit 74. A driver circuit 402 that is powered by a programming supply VPP replaces the inverter. Driver circuit 402, which may be a type of level shifter, provides a voltage transfer function that may be better than that provided by inverter 88 for the particular type of a non-volatile memory cell. A higher voltage, for example, may allow for a higher voltage for source voltage VS resulting in faster programming. In such case level shifting by driver circuit 402 may enable the ability to take advantage of that. For example, driver circuit 402 may provide a high voltage, due to level shifting, when the input BL1 is low such that NBL1 provides a programming voltage to an NVM cell. In one alternate embodiment, such a cell will be programmed to a logic low state, while the initial erase condition will be a logic high. In yet another embodiment, driver circuit 402 may provide a high voltage when the input BL1 is high such that NBL1 provides voltage to an NVM cell necessary for hot carrier injection. In this alternate embodiment, such a cell will be programmed to a logic high state, while the initial erase condition will be a logic low. In these alternate embodiments, the memory cells 28, 30, 32, 34, 36, 37, 38, and 40 may consist of a single transistor, so access transistors 108, 114, 118, 122, 124, 126, 132, and 138 are not needed. Transistor 404 functions the same as transistor 86.

Thus it is seen that the use of a transfer circuit between the bit lines of the volatile memory and the NVM can be effective in providing a better situation for programming of the NVM cells.

By now it should be appreciated that there has been provided a memory device having a volatile memory cell and a non-volatile memory cell. The memory device further includes a transfer system connected between the volatile memory cell and the non-volatile memory cell, the transfer system operates to allow data transfer from the volatile memory cell to the non-volatile memory cell when the memory device is operating in a first mode and allow data transfer data from the non-volatile memory cell to the volatile memory cell when the memory device is operating in a second mode. The memory device may have a further characterization by which the transfer system includes a first restore transistor having a first electrode coupled to a true bit line of the volatile memory cell, a second electrode coupled to a true bit line of the non-volatile memory cell, and a control electrode coupled to a restore enable signal. The memory device may further include. The memory device may further include a first store transistor and a first inverter having an input connected to the true bit line of the volatile memory cell and an output coupled to a first electrode of the first store transistor, the first store transistor further having a second electrode coupled to the true bit line of the non-volatile memory cell and a control gate coupled to a store enable signal, wherein the true bit line of the volatile memory cell is further coupled to a first electrode of a first transistor of the volatile memory cell and the true bit line of the non-volatile memory cell is further coupled to a first electrode of a first transistor of the non-volatile memory cell. The memory device may have a further characterization by which the transfer system further includes a second restore transistor having a first electrode coupled to a complementary bit line of the volatile memory cell, a second electrode coupled to a complementary bit line of the non-volatile memory cell, and a control electrode coupled to the restore enable signal, a second store transistor, and a second inverter having an input connected to the complementary bit line of the volatile memory cell and an output coupled to a first electrode of the second store transistor, the second store transistor further having a second electrode coupled to the complementary bit line of the non-volatile memory cell and a control gate coupled to the store enable signal, wherein the complementary bit line of the volatile memory cell is further coupled to a first electrode of a second transistor of the volatile memory cell and the complementary bit line of the non-volatile memory cell is further coupled to a first electrode of a second transistor of the non-volatile memory cell. The memory device may have a further characterization by which the volatile memory cell is an SRAM memory cell. The memory device may have a further characterization by which the non-volatile memory cell is one of a split gate memory cell and a 1-transistor memory cell. The memory device may have a further characterization by which the transfer system includes a first restore transistor having a first electrode coupled to one of a data node and a true bit line of the volatile memory cell, a second electrode coupled to a true bit line of the non-volatile memory cell, and a control gate coupled to a restore signal and a first store transistor having a first electrode coupled to one of the data node and the true bit line of the volatile memory cell, a second electrode coupled to a complementary bit line of the non-volatile memory cell and a control gate coupled to a store signal, wherein the true bit line of the non-volatile memory cell is further coupled to a first electrode of a first transistor of the non-volatile memory cell and the complementary bit line of the non-volatile memory cell is further coupled to a first electrode of a second transistor of the non-volatile memory cell. The memory device may have a further characterization by which the transfer system further includes a second restore transistor having a first electrode coupled to one of a complementary data node and a complementary bit line of the volatile memory cell, a second electrode coupled to the complementary bit line of the non-volatile memory cell, and a control gate coupled to a restore signal and a second store transistor having a first electrode coupled to one of the complementary data node and the complementary bit line of the volatile memory cell, a second electrode coupled to the true bit line of the non-volatile memory cell and a control gate coupled to the store signal. The memory device may have a further characterization by which the transfer system further includes a first restore transistor having a first electrode coupled to a true bit line of the volatile memory cell, a second electrode coupled to a true bit line of the non-volatile memory cell, and a control electrode coupled to a restore enable signal, a first store transistor, and a first level shifter having an input connected to the true bit line of the volatile memory cell and an output coupled to a first electrode of the first store transistor, the first store transistor further having a second electrode coupled to the true bit line of the non-volatile memory cell and a control gate coupled to a store enable signal, wherein the true bit line of the volatile memory cell is further coupled to a first electrode of a first transistor of the volatile memory cell and the true bit line of the non-volatile memory cell is further coupled to a first electrode of a first transistor of the non-volatile memory cell. The memory device may have a further characterization by which the transfer system further includes a second restore transistor having a first electrode coupled to a complementary bit line of the volatile memory cell, a second electrode coupled to a complementary bit line of the non-volatile memory cell, and a control electrode coupled to the restore enable signal, a second store transistor, and a second level shifter having an input connected to the complementary bit line of the volatile memory cell and an output coupled to a first electrode of the second store transistor, the second store transistor further having a second electrode coupled to the complementary bit line of the non-volatile memory cell and a control gate coupled to the store enable signal, wherein the complementary bit line of the volatile memory cell is further coupled to a first electrode of a second transistor of the volatile memory cell and the complementary bit line of the non-volatile memory cell is further coupled to first electrode of a second transistor of the non-volatile memory cell.

Also disclosed is a memory device having a first volatile memory cell having a first transistor with a first electrode coupled to a first true bit line, and a second transistor with a first electrode coupled to a first complementary bit line. The memory device further includes a first non-volatile memory cell having a first transistor with a first electrode coupled to a second true bit line, and a second transistor with a first electrode coupled to a second complementary bit line. The memory device further includes a transfer system coupled between the first volatile memory cell and the first non-volatile memory cell, the transfer system is operable to transfer data from the first volatile memory cell to the first non-volatile memory cell during a store operation and to transfer data from the first non-volatile memory cell to the first volatile memory cell during a restore operation, wherein during the store and restore operations, the transfer system couples the first true bit line of the first volatile memory cell to the second true bit line of the first non-volatile memory cell and couples the first complementary bit line of the first volatile memory cell to the second complementary bit line of the first non-volatile memory cell. The memory device may have a further characterization by which the transfer system includes a first transfer circuit including a first transfer element having an input coupled to the first true bit line, a first transfer transistor having a first electrode coupled to an output of the first transform element, a second electrode coupled to the second true bit line, and a control gate coupled a store signal, and a second transfer transistor having a first electrode coupled to the first true bit line, a second electrode coupled to the second true bit line and a control gate coupled to a restore signal. The memory device may have a further characterization by which the transfer system further includes a second transfer circuit including a first transfer element having an input coupled to the first complementary bit line, a first transfer transistor having a first electrode coupled to an output of the first transform element, a second electrode coupled to the second complementary bit line, and a control gate coupled the store signal and a second transfer transistor having a first electrode coupled to the first complementary bit line, a second electrode coupled to the second complementary bit line and a control gate coupled to the restore signal. The memory device may have a further characterization by which the first and second transfer circuits comprise one of a group consisting of inverters and level shifters. The memory device may have a further characterization by which the transfer system includes a first restore transistor having a first electrode coupled to a data node of the first volatile memory cell, a second electrode coupled to the second true bit line of the first non-volatile memory cell, and a control gate coupled to a restore signal, and a second store transistor having a first electrode coupled to the data node of the volatile memory cell, a second electrode coupled to the second complementary bit line of the first non-volatile memory cell and a control gate coupled to a store signal, the second true bit line of the non-volatile memory cell is further coupled to a first electrode of a first transistor of the first non-volatile memory cell, and the second complementary bit line of the non-volatile memory cell is further coupled to a first electrode of a second transistor of the first non-volatile memory cell. The memory device may have a further characterization by which the transfer system further includes a second restore transistor having a first electrode coupled to a complementary data node of the first volatile memory cell, a second electrode coupled to the second complementary bit line of the first non-volatile memory cell, and a control gate coupled to a restore signal and a second store transistor having a first electrode coupled to the complementary data node of the first volatile memory cell, a second electrode coupled to the second true bit line of the first non-volatile memory cell and a control gate coupled to the store signal. The memory device may have a further characterization by which the volatile memory cell is an SRAM memory cell. The memory device may have a further characterization by which the non-volatile memory cell is one of a split gate memory cell and a 1-transistor memory cell.

Disclosed also is a method of operating a memory device. The method includes, during a first operation, transferring data from an array of volatile memory cells to an array of corresponding non-volatile memory cells via a transfer system. The method further includes, during a second operation, transferring the data from the array of non-volatile memory cells to the array of volatile memory cells via the transfer system, wherein the transfer system is coupled between the volatile memory cells and the non-volatile memory cells by true bit lines and complementary bit lines. The method may have a further characterization by which, during the first operation, the method includes inverting a voltage on a first of the true bit lines coupled to the volatile memory cells to form a first inverted voltage and coupling the first inverted voltage to a second of the true bit lines coupled to the non-volatile memory cells and inverting a voltage on a first of the complementary bit lines coupled to the volatile memory cells to form a second inverted voltage and coupling the second inverted voltage to a second of the complementary bit lines coupled to the non-volatile memory cells. The method may have a further characterization by which, during the first operation, the method includes shifting a voltage on a first of the true bit lines coupled to the volatile memory cells to form a first shifted voltage and coupling the first shifted voltage to a second of the true bit lines coupled to the non-volatile memory cells and shifting a voltage on a first of the complementary bit lines coupled to the volatile memory cells to form a second shifted voltage and coupling the second shifted voltage to a second of the complementary bit lines coupled to the non-volatile memory cells.

Although the invention is described herein with reference to specific embodiments, various modifications and changes can be made without departing from the scope of the present invention as set forth in the claims below. For example, an inverter may consist of any circuit providing the function of logic inversion. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A memory device comprising:
   a column of a memory array including:
      volatile memory cells connected to a first true bit line and a first complementary bit line;
      non-volatile memory cells connected to a second true bit line and a second complementary bit line; and
      a transfer system connected between the volatile memory cells and the non-volatile memory cells and between the first and second true bit lines and the first and second complementary bit lines, the transfer system operates to:
         allow data transfer from the volatile memory cells to the non-volatile memory cells when the memory device is operating in a first mode; and
         allow data transfer data from the non-volatile memory cells to the volatile memory cells when the memory device is operating in a second mode.

2. The memory device of claim 1, wherein the transfer system comprises:
   a first restore transistor having a first electrode coupled to the first true bit line, a second electrode coupled to the second true bit line, and a control electrode coupled to a restore enable signal;
   a first store transistor; and
   a first inverter having an input connected to the first true bit line and an output coupled to a first electrode of the first store transistor, the first store transistor further having a second electrode coupled to the second true bit line and a control gate coupled to a store enable signal;
   the first true bit line is further coupled to:
      a first electrode of a first transistor of each of the volatile memory cells; and
   the second true bit line is further coupled to:
      a first electrode of a first transistor of each of the non-volatile memory cells.

3. The memory device of claim 2 wherein the transfer system further comprises:
   a second restore transistor having a first electrode coupled to the first complementary bit line, a second electrode coupled to the second complementary bit line, and a control electrode coupled to the restore enable signal;
   a second store transistor; and
   a second inverter having an input connected to the first complementary bit line and an output coupled to a first electrode of the second store transistor, the second store transistor further having a second electrode coupled to the second complementary bit line and a control gate coupled to the store enable signal;
   the first complementary bit line is further coupled to:
      a first electrode of a second transistor of each of the volatile memory cells; and
   the second complementary bit line is further coupled to:
      a first electrode of a second transistor of each of the non-volatile memory cells.

4. The memory device of claim 1 wherein the volatile memory cells are SRAM memory cells.

5. The memory device of claim 1 wherein the non-volatile memory cells are one of a split gate memory cell and a 1-transistor memory cell.

6. The memory device of claim 1, wherein the transfer system comprises:
   a first restore transistor having a first electrode coupled to one of a data node and the first true bit line, a second electrode coupled to the second true bit line, and a control gate coupled to a restore signal; and
   a first store transistor having a first electrode coupled to one of the data node and the first true bit line, a second electrode coupled to the second complementary bit line and a control gate coupled to a store signal;
   the second true bit line is further coupled to a first electrode of a first transistor of each of the non-volatile memory cells; and
   the second complementary bit line is further coupled to a first electrode of a second transistor of each of the non-volatile memory cells.

7. The memory device of claim 6 wherein the transfer system further comprises:
   a second restore transistor having a first electrode coupled to one of a complementary data node and the first complementary bit line, a second electrode coupled to the second complementary bit line, and a control gate coupled to a restore signal; and
   a second store transistor having a first electrode coupled to one of the second complementary data node and the second complementary bit line, a second electrode coupled to the second true bit line and a control gate coupled to the store signal.

8. The memory device of claim 1 wherein the transfer system further comprises:
   a first restore transistor having a first electrode coupled to the first true bit line, a second electrode coupled to the second true bit line, and a control electrode coupled to a restore enable signal;
   a first store transistor; and
   a first level shifter having an input connected to the first true bit line and an output coupled to a first electrode of the first store transistor, the first store transistor further having a second electrode coupled to the second true bit line and a control gate coupled to a store enable signal;
   the first true bit line is further coupled to:
      a first electrode of a first transistor of each of the volatile memory cells; and
   the second true bit line is further coupled to:
      a first electrode of a first transistor of each of the non-volatile memory cells.

9. The memory device of claim 8 wherein the transfer system further comprises:
   a second restore transistor having a first electrode coupled to the first complementary bit line, a second electrode coupled to the second complementary bit line, and a control electrode coupled to the restore enable signal;
   a second store transistor; and
   a second level shifter having an input connected to the first complementary bit line and an output coupled to a first electrode of the second store transistor, the second store transistor further having a second electrode coupled to the second complementary bit line and a control gate coupled to the store enable signal;
   the first complementary bit line is further coupled to:
      a first electrode of a second transistor of each of the volatile memory cells; and
   the second complementary bit line is further coupled to:
      a first electrode of a second transistor of each of the non-volatile memory cells.

10. A method of operating a memory device comprising:
    during a first operation, transferring data from an array of volatile memory cells to an array of corresponding non-volatile memory cells via a transfer system; and
    during a second operation, transferring the data from the array of non-volatile memory cells to the array of volatile memory cells via the transfer system,
    wherein the transfer system is coupled between the volatile memory cells and the non-volatile memory cells by first true bit lines, second true bit lines, first complementary bit lines, and second complementary bit lines,
       the array of volatile memory cells includes at least one column having two or more of the volatile memory cells,
       the array of non-volatile memory cells includes at least one column having two or more of the non-volatile memory cells,
       each of the first true bit lines and first complementary bit lines are connected to a corresponding one of the at least one column having two or more of the volatile memory cells, and
       each of the second true bit lines and second complementary bit lines are connected to the corresponding one of the at least one column having two or more of the non-volatile memory cells.

11. The method of claim 10 wherein during the first operation, the method includes:
    inverting a voltage on the first true bit lines to form a first inverted voltage and coupling the first inverted voltage to the second true bit lines; and
    inverting a voltage on the first complementary bit lines coupled to the volatile memory cells to form a second inverted voltage and coupling the second inverted voltage to the second complementary bit lines coupled to the non-volatile memory cells.

12. The method of claim 10 wherein during the first operation, the method includes:
    shifting a voltage on the first the true bit lines to form a first shifted voltage and coupling the first shifted voltage to the second true bit lines; and
    shifting a voltage on the first the complementary bit lines to form a second shifted voltage and coupling the second shifted voltage to the second complementary bit lines coupled to the non-volatile memory cells.

* * * * *